United States Patent
Bang

(10) Patent No.: US 11,423,994 B2
(45) Date of Patent: Aug. 23, 2022

(54) TIMING CONTROLLER FOR CONTROLLING MEMORY DEVICE, OPERATING METHOD THEREOF, AND ELECTRONIC DEVICE INCLUDING THE TIMING CONTROLLER

(71) Applicant: SILICON WORKS CO., LTD., Daejeon (KR)

(72) Inventor: Ho Il Bang, Daejeon (KR)

(73) Assignee: SILICON WORKS CO., LTD., Daejeon (KR)

( * ) Notice: Subject to any disclaimer, the term of this patent is extended or adjusted under 35 U.S.C. 154(b) by 39 days.

(21) Appl. No.: 17/110,901

(22) Filed: Dec. 3, 2020

(65) Prior Publication Data
US 2021/0193235 A1    Jun. 24, 2021

(30) Foreign Application Priority Data
Dec. 23, 2019 (KR) .......................... 10-2019-0172905

(51) Int. Cl.
*G11C 16/04* (2006.01)
*G11C 16/32* (2006.01)
*G06F 3/06* (2006.01)

(52) U.S. Cl.
CPC ............ *G11C 16/32* (2013.01); *G06F 3/0604* (2013.01); *G06F 3/0659* (2013.01); *G06F 3/0679* (2013.01); *G11C 16/0483* (2013.01)

(58) Field of Classification Search
CPC ... G11C 16/32; G11C 16/0483; G06F 3/0604; G06F 3/0659; G06F 3/0679
See application file for complete search history.

(56) References Cited

U.S. PATENT DOCUMENTS

| | | | |
|---|---|---|---|
| 9,779,703 B2* | 10/2017 | Hong | G09G 3/2096 |
| 2007/0033338 A1* | 2/2007 | Tsern | G11C 29/50016 711/106 |
| 2007/0086268 A1* | 4/2007 | Shaetfer | G06F 13/1689 365/233.1 |
| 2007/0217559 A1* | 9/2007 | Stott | G11C 7/22 375/355 |

FOREIGN PATENT DOCUMENTS

| KR | 101332774 B1 | 11/2013 |
|---|---|---|
| KR | 10-2018-0006852 A | 1/2018 |

* cited by examiner

*Primary Examiner* — Pho M Luu
(74) *Attorney, Agent, or Firm* — Harness, Dickey & Pierce, P.L.C.

(57) ABSTRACT

An electronic device includes a memory device and a timing controller configured to output control signals, which are generated using a first clock signal, to the memory device, generate first captured data by capturing data, which is output from the memory device, using the first clock signal in response to the control signals, and generate control signals using a second clock signal and output the control signals to the memory device when the first captured data is not valid data.

14 Claims, 12 Drawing Sheets

| SYMBOL | PARAMETER |
|---|---|
| tCLS | CLE Setup Time |
| tCLH | CLE Hold Time |
| tALS | ALE Setup Time |
| tWP | Write Pulse Width |
| tWH | WE High Hold Time |
| tRP | Read Pulse Width |
| tRHZ | RE High to Output High Impedance |
| tREA | RE Access Time |

FIG. 8

TIMING CONTROLLER FOR CONTROLLING MEMORY DEVICE, OPERATING METHOD THEREOF, AND ELECTRONIC DEVICE INCLUDING THE TIMING CONTROLLER

CROSS-REFERENCE TO RELATED APPLICATIONS

This application claims the benefit of the Korean Patent Applications No. 10-2019-0172905 filed on Dec. 23, 2019, which are hereby incorporated by reference as if fully set forth herein.

FIELD

The present disclosure relates to a timing controller for controlling a memory device, an operating method thereof, and an electronic device including the timing controller.

BACKGROUND

Flash memories are nonvolatile data storage devices capable of retaining data even after power is removed. Types of flash memory devices include NAND type flash memories used as a data storage device and NOR type flash memories used as a code storage device.

For example, a NAND type flash memory controller communicates with a NAND type flash memory using a set of interface signals defined by an Open NAND Flash Interface (ONFI) working group. The interface signals include a chip enable signal (CE), an address latch enable signal (ALE), a command latch enable signal (CLE), a write enable signal (WE), a read enable signal (RE), a write protect signal (WP), a data strobe signal (DQS), and data signals (DQs).

SUMMARY

The present disclosure is directed to providing a timing controller for selecting parameters matching a signal path delay, which is a delay of a signal path for transmission of data output from a memory device, in response to the control signals for control of a motion of the memory device in an initialization process while changing parameters of the control signals and a frequency of a clock signal associated with generation of the control signals until it is determined that the data is valid data; and an electronic device including the same.

According to one aspect of the present disclosure, an electronic device includes a memory device and a timing controller. The timing controller outputs control signals generated using a first clock signal to the memory device, generates first captured data by capturing first data, which is output from the memory device, using the first clock signal in response to the control signals, and generates control signals using a second clock signal and outputs the control signals to the memory device when the first captured data is not valid data.

According to another aspect of the present disclosure, a timing controller includes a clock signal generator configured to output a first clock signal or a second clock signal in response to a selection signal, and a memory host controller configured to output control signals generated using the first clock signal to a memory device, capture first data, which is output from the memory device using the first clock signal in response to the control signals, to generate first captured data, and generate the control signals using the second clock signal and output the control signals to the memory device when the first captured data is not valid data.

According to another aspect of the present disclosure, an electronic device includes a memory device and a timing controller. The timing controller selects parameters, which match a signal path delay, of control signals for control of a motion of the memory device while changing parameters of the control signals and a frequency of a clock signal associated with generation of the control signals in response to the control signals until it is determined that data output from the memory device is valid data, the signal path delay being a delay of a signal path for transmission of the data.

According to another aspect of the present disclosure, an operating method of a timing controller includes determining whether data from a memory device is valid data in response to control signals generated using a clock signal and, until parameters of the control signals matching to a signal path delay are selected, changing parameters of the control signals and a frequency of the clock signal associated with the parameters of the control signals, the signal path delay being a signal path for transmission of the data.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIG. 8 illustrates parameters of the control signals for the read ID command of FIG. 7;

DETAILED DESCRIPTION

Terms used herein should be understood as follows.

It should be understood that the singular forms "a," "an," and "one" are intended to include the plural forms as well, unless the context clearly indicates otherwise. The terms first, second, and the like may only be used to distinguish one element from another, and thus the scope of the present invention should not be limited by these terms.

It should be understood that terms such as "comprises," "includes," or "having" do not preclude the presence or addition of one or more other features, integers, steps, operations, elements, components, or groups thereof.

The term "at least one" should be understood as including any combination obtainable from one or more related items. For example, the phrase "at least one of a first item, a second item, and a third item" may refer to each of the first item, the second item, or the third item and may also refer to any combination obtainable from two or more of the first item, the second item, and the third item.

Figure 1:
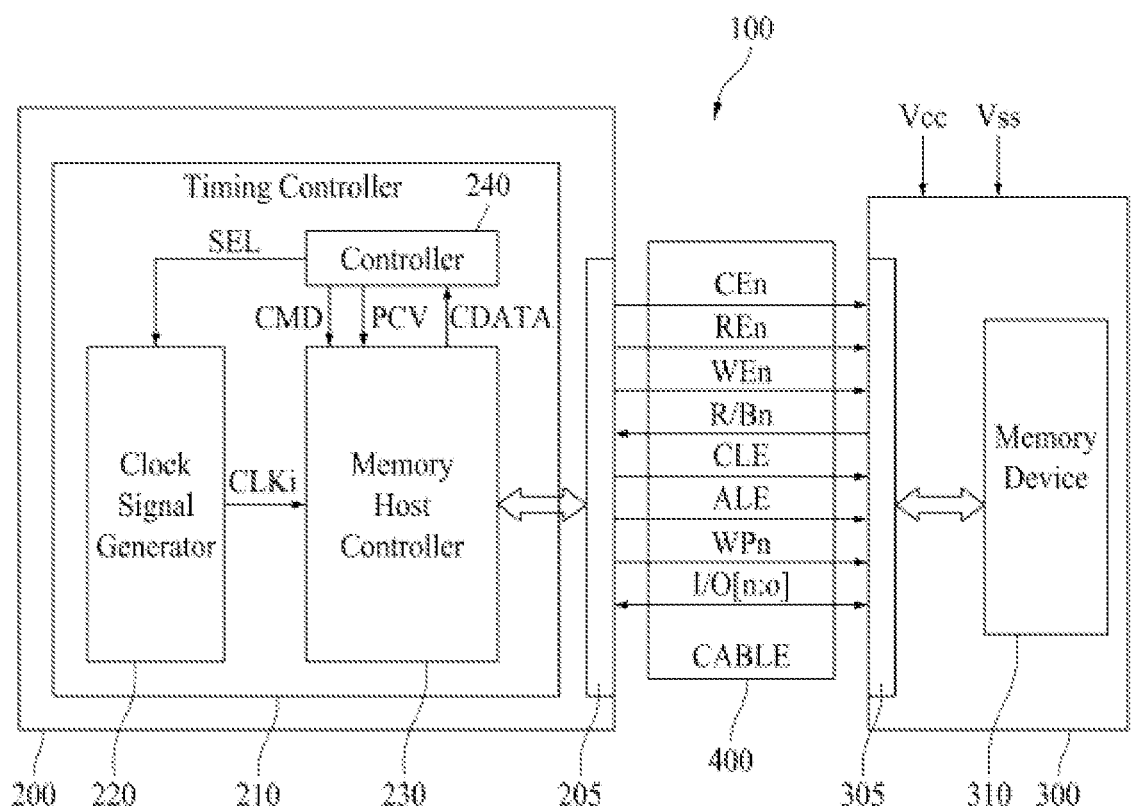
FIG. 1 is a block diagram of a memory system including a timing controller and a memory device according to an embodiment of the present disclosure.

FIG. 1 is a block diagram of a memory system including a timing controller and a memory device according to an embodiment of the present disclosure.

Referring to FIG. 1, a memory system 100 included in an electronic device includes a timing controller 210 on or above a first printed circuit board (PCB) 200, a memory device 310 on or above a second PCB 300, and a cable 400.

The electronic device including the memory system 100 may be a TV, a display device, a kiosk, or a car center fascia for a vehicle but is not limited thereto.

The timing controller 210 that controls operations of the memory device 310 includes a clock signal generator 220, a memory host controller 230, and a controller 240.

The timing controller 210 selects (or automatically selects) parameters matching to a signal path delay while changing parameters of control signals CEn, REn, WEn, CLE, ALE, and WPn and a clock signal (or a frequency of a clock signal) related to generation of the control signals CEn, REn, WEn, CLE, ALE, and WPn. The control signals CEn, REn, WEn, CLE, ALE, and WPn correspond to signals for controlling operations of the memory device 310 (e.g., a read operation, a write (or program) operation, an erase operation, and the like). The signal path delay may be determined according to a length of a signal path (e.g., the cable 400).

The parameters of the control signals CEn, REn, WEn, CLE, ALE, and/or WPn may be determined by a clock signal CLKi (i is a natural number) output from the clock signal generator 220 and parameter control values PCV output from the controller 240. The parameter control values PCV may include one or more parameter control values.

Here, CEn represents a chip enable signal, REn represents a read enable signal, WEn represents a write enable signal, R/Bn represents a ready/busy signal, and CLE represents a command latch enable signal. ALE represents an address latch enable signal, and WPn represents a write protect signal. In each of the signals CEn, REn, WEn, R/Bn, and WPn, n represents low active.

The memory device 310 may include a NAND flash memory device or a three-dimensional (3D) NAND flash memory device. The operations of the memory device 310 may include a command cycle related to the read operation, the write (or program) operation or the erase operation, an address cycle, a data input cycle, and/or a data output cycle.

The clock signal generator 220 generates clock signals having different pulse widths (or frequencies) and outputs one of the clock signals to the memory host controller 230 according to a selection signal SEL.

Figure 2:
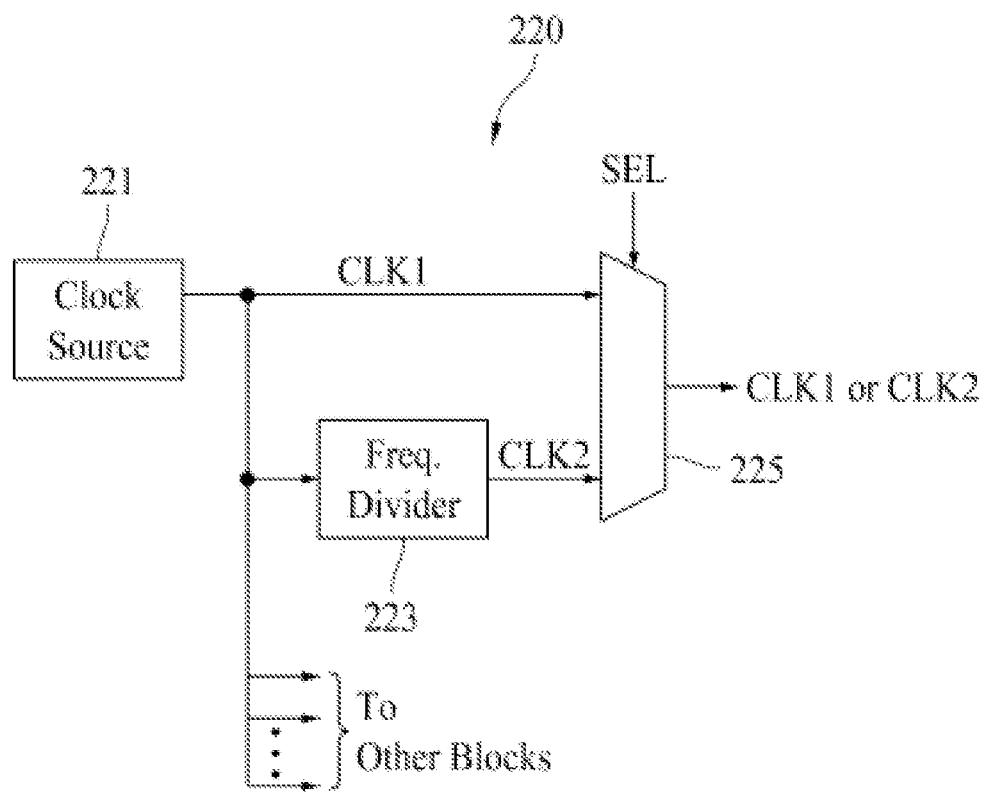
FIG. 2 is a block diagram of a clock signal generator illustrated in FIG. 1.

FIG. 2 is a block diagram of the clock signal generator 220 illustrated in FIG. 1. Referring to FIG. 2, the clock signal generator 220 includes a clock source 221, a frequency divider 223, and a multiplexer 225.

The clock source 221 generates a first clock signal CLK1 having a first frequency. In embodiments, the clock source 221 may be embodied as a phase-locked loop (PLL) or a delay-locked loop (DLL) but is not limited thereto.

The frequency divider 223 generates a second clock signal CLK2 having a second frequency using the first clock signal CLK1 having the first frequency. For example, the frequency divider 223 generates the second clock signal CLK2 having the second frequency by dividing the first clock signal CLK1 having the first frequency, and thus the first frequency may be higher than the second frequency. The first clock signal CLK1 may be referred to as a clock signal having the first frequency, and the second clock signal CLK2 may be referred to as a clock signal having the second frequency.

The multiplexer 225 outputs the first clock signal CLK1 having the first frequency or the second clock signal CLK2 having the second frequency in response to a selection signal SEL.

Although for convenience of description, one frequency divider 223 and a 2-input 1-output multiplexer 225 are illustrated in FIG. 2, the present disclosure is not limited thereto. The clock signal generator 220 may include two or more frequency dividers 223, and thus the number of input terminals of the multiplexer 225 and the number of selection signals may be changed. The first clock signal CLK1 having the first frequency may be input to other blocks (or other circuits) included in the timing controller 210.

The memory host controller 230 receives the clock signal CLK1 or CLK2, a command CMD, and parameter control values PCV. The memory host controller 230 may adjust (or determine) the parameters of the control signals CEn, REn, WEn, CLE, ALE and WPn corresponding to the command CMD using the frequency (or period) of the clock signal CLK1 or CLK2 and the parameter control values PCV and generate the control signals CEn, REn, WEn, CLE, ALE and WPn having the adjusted (or determined) parameters. The memory host controller 230 may output the generated control signals CEn, REn, WEn, CLE, ALE, and WPn to the memory device 310 through the cable 400.

Accordingly, the memory device 310 may decode the control signals CEn, REn, WEn, CLE, ALE, and WPn defined by the adjusted parameters and perform an operation (or command) corresponding to a result of the decoding.

For example, when the control signals CEn, REn, WEn, CLE, ALE, and WPn correspond to the read operation, the memory device 310 may transmit read data to the memory host controller 230 through the cable 400 in response to the control signals CEn, REn, WEn, CLE, ALE, and WPn.

During the read operation, the memory host controller 230 may capture the read data using the clock signal CLK1 or CLK2 to generate captured data CDATA and transmit the captured data CDATA to the controller 240.

The controller 240 determines whether the captured data CDATA is valid data. For example, the controller 240 may compare reference data with the captured data CDATA and determine that the capture data CDATA is valid data when the reference data and the capture data CDATA match. When the reference data and the capture data CDATA do not match, the controller 240 may determine that the captured data CDATA is not valid data.

When a command is a read ID command, the reference data may be maker code of the memory device 310 or device code of the memory device 310 but is not limited thereto. The controller 240 may be a micro-controller unit (MCU).

The memory device 310 may store firmware and a configuration necessary for the timing controller 210. When the memory system 100 is booted or performs an initialization operation, the timing controller 210 may read the firmware and/or the configuration from the memory device 310.

The cable 400 connects a first connector 205 connected to the first PCB 200 and a second connector 305 connected to the second PCB 300. The first connector (or first input/output (I/O) port) 205 is connected to the timing controller 210, and the second connector (or second I/O port) 305 is connected to the memory device 310.

The cable 400 may include lines for transmission of a power signal Vcc, a ground signal Vss, the control signals CEn, REn, WEn, R/Bn, CLE, ALE, and WPn, and I/O signals I/O[n:0]. The I/O signals I/O[n:0] may include an address, a command, and data. The cable 400 may be a flat flexible cable.

In embodiments, the power signal Vcc and the ground signal Vss may be supplied to the memory device 310 through the lines included in the cable 400 or through separate power supply lines rather than the cable 400.

Figure 3:
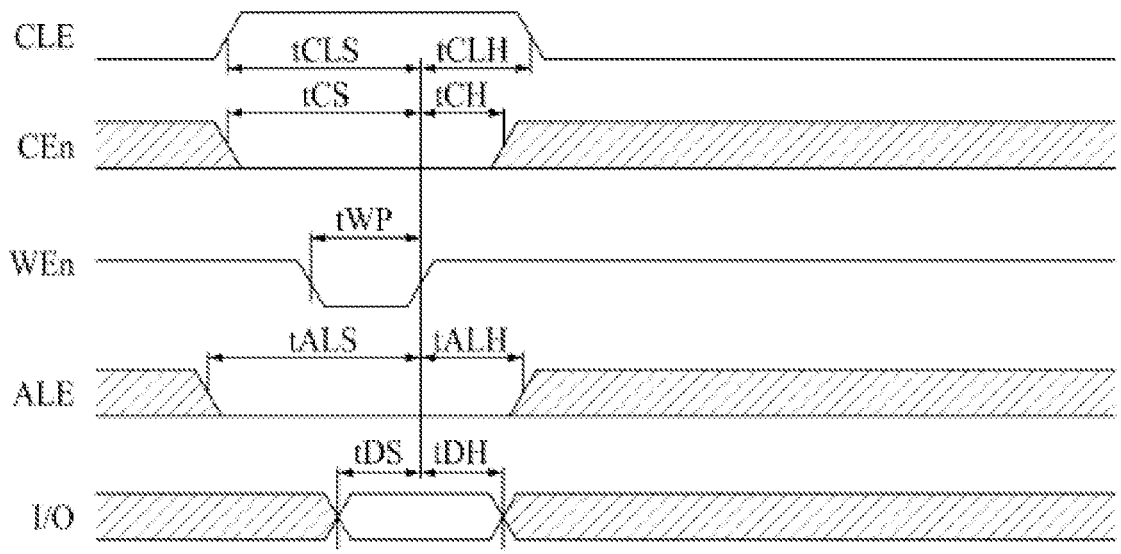
FIG. 3 is a timing diagram of a command cycle.

FIG. 3 is a timing diagram of a command cycle (or command input cycle). Control signals illustrated in FIG. 3 include control signals CLE, CEn, WEn, and ALE, and parameters of the control signals CLE, CEn, WEn, and ALE include a CLE setup time tCLS, a CLE hold time tCLH, a CE setup time tCS, a CE hold time tCH, a WE pulse width tWP, an ALE setup time tALS, an ALE hold time tALH, a data setup time tDS, and/or a data hold time tDH.

The memory host controller 230 controls at least one of the parameters tCLS, tCLH, tCS, tCH, tWP, tALS, tALH, etc. using a clock signal CLK1 or CLK2 and parameter control values PCV.

Figure 4:
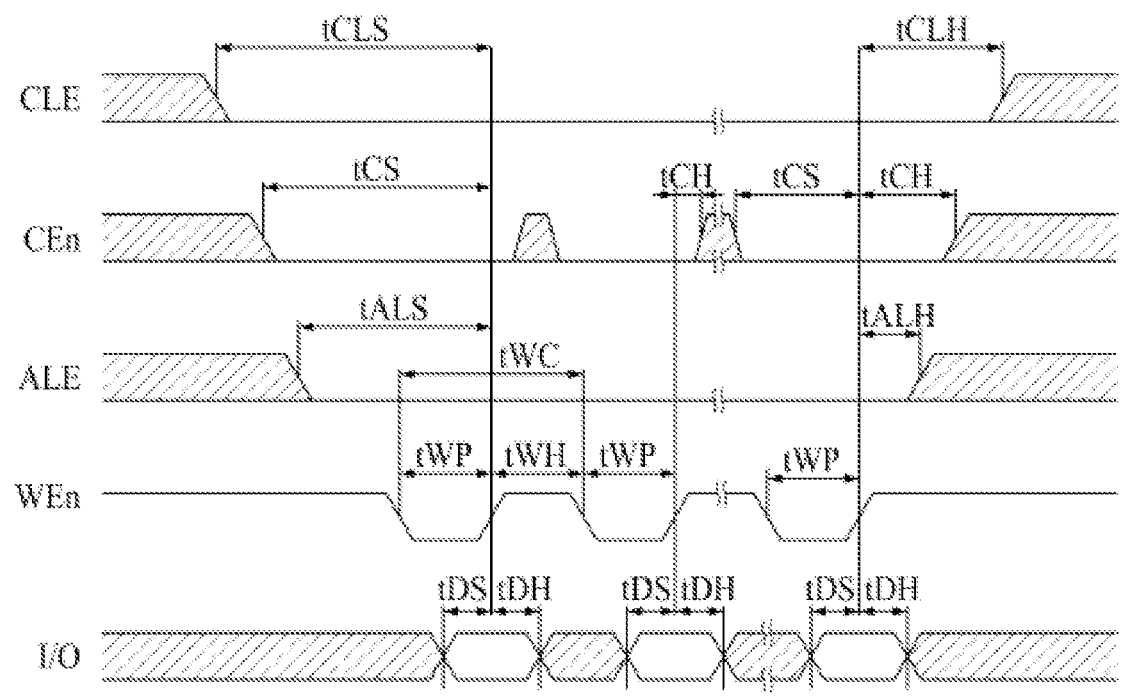
FIG. 4 is a timing diagram of a data input cycle.

FIG. 4 is a timing diagram of a data input cycle. Control signals illustrated in FIG. 4 include control signals CLE, CEn, ALE, and Wen. Parameters of the control signals CLE, CEn, ALE, and WEn include a CLE setup time tCLS, a CLE hold time tCLH, a CE setup time tCS, a CE hold time tCH, an ALE setup time tALS, an ALE hold time tALH, a WE pulse width tWP, a WE high hold time tWH, a data setup time tDS, and/or a data hold time tDH.

The memory host controller 230 adjusts at least one of the parameters tCLS, tCLH, tCS, tCH, tALS, tALH, tWP, tWH, etc. using parameter control values PCV of a clock signal CLK1 or CLK2.

Figure 5:
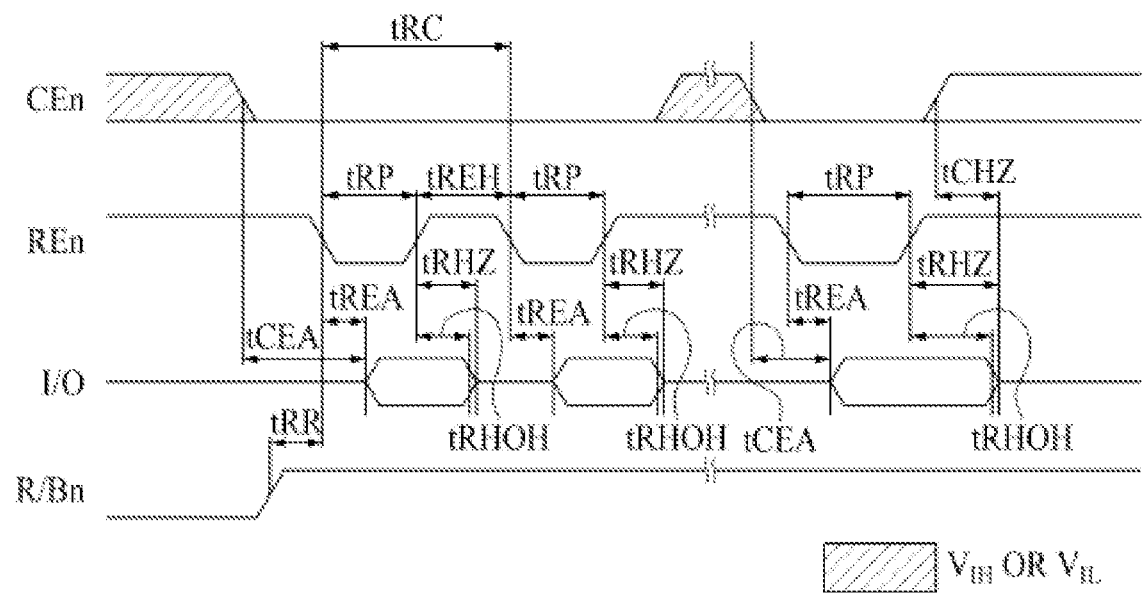
FIG. 5 is a timing diagram of a serial read cycle.

FIG. 5 is a timing diagram of a serial read cycle. Control signals illustrated in FIG. 5 include control signals CEn and Ren. Timing parameters of the control signals CEn and REn include an RE access time tRC, an RE pulse width tRP, an RE high hold time tREH, a CE high-to-output hi-Z (tCHZ), a CE access time tCEA, an RE access time tREA, an RE high-to-output hi-Z (tRHZ), and an RE high-to-output hold (tRHOH).

The memory host controller 230 controls at least one of the parameters tRC, tRP, tREH, tCHZ, tCEZ, and tRHOH using a clock signal CLK1 or CLK2 and parameter control values PCV.

Figure 6:
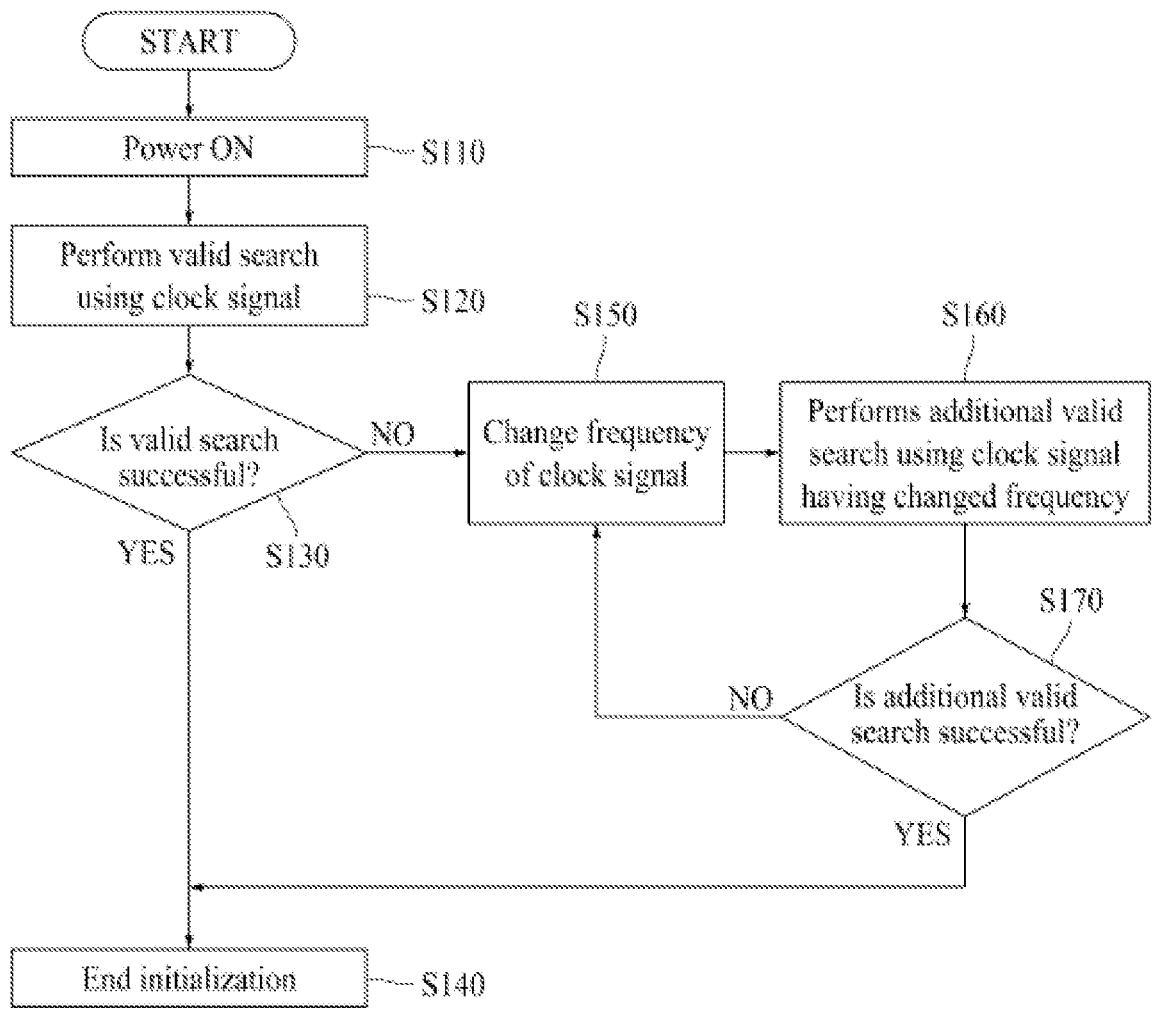
FIG. 6 is a flowchart illustrating an operation of the memory system of FIG. 1.

FIG. 6 is a flowchart illustrating an operation of the memory system 100 of FIG. 1.

First, the memory system 100 is powered on (S110).

The timing controller 210 performs a valid search using a first clock signal CLK1 having a first frequency (S120). Here, the valid search refers to a process of setting parameters of control signals matching to a delay of a signal path (e.g., a length of the cable 400) between the timing controller 210 and the memory device 310 while gradually increasing parameter control values PCV from minimum values to maximum values, even when the signal path delay is not known. Here, it is assumed that each of the minimum values refers to a minimum value of one of the parameter control values PCV, and each of the maximum values refers to a maximum value of one of the parameter control values PCV.

As described above, the parameter of each of the control signals may be determined according to a function of each of the first clock signal CLK1 and the parameter control values PCV.

Specifically, the valid search may be a process of finding whether the captured data CDATA is valid data while gradually increasing the parameter control values PCV from minimum values to maximum values without changing the first frequency of the first clock signal CLK1.

When the valid search using the first clock signal CLK1 having the first frequency is successful (YES in S130), i.e., when the captured data CDATA is valid data, an initialization process is ended (S140). For example, the valid search (S120) may be performed before booting of the memory system 100.

However, when the valid search performed while gradually increasing the parameter control values PCV a predetermined number of times during supplying of the first clock signal CLK1 having the first frequency is not successful (NO in S130), the timing controller 210 selects a second clock signal CLK2 having a second frequency instead of the first clock signal CLK1 having the first frequency to perform an additional valid search (S150). That is, a frequency of a clock signal is changed from the first frequency to the second frequency (S150).

The timing controller 210 performs the additional valid search using the clock signal having the changed frequency, i.e., the second clock signal CLK2 (S160).

The additional valid search may be a process of finding whether the captured data CDATA is valid data while gradually increasing the parameter control values PCV from minimum values to maximum values without changing the second frequency of the second clock signal CLK2.

When the additional valid search using the second clock signal CLK2 having the second frequency is successful (YES in S170), i.e., when the captured data CDATA is valid data, an initialization process is ended (S140). For example, the additional valid search (S170) may be performed before the booting of the memory system 100.

However, when the additional valid search performed while gradually increasing the parameter control values PCV a predetermined number of times during supplying of the second clock signal CLK2 having the second frequency is not successful (NO in S170), the timing controller 210 selects a third clock signal having a third frequency instead of the second clock signal CLK2 having the second frequency to perform another additional valid search (S150). Operation S160 is performed using the third clock signal. In this case, the third clock signal is a clock signal generated by dividing the frequency of the first clock signal CLK1.

Operations of the memory system 100 have been described above in detail with reference to FIGS. 1 to 6.

During a first phase of the first clock signal CLK1, the controller 240 may generate a selection signal SEL instructing to output the first clock signal CLK1, and generate first parameter control values PCV including first values. Each of the first values may refer to one of the first parameter control values PCV and may be the same or different from each other.

The memory host controller 230 may adjust parameters of control signals using a period of the first clock signal CLK1 and the first parameter control values PCV and output the control signals, the parameters of which are adjusted to the memory device 310, through the cable 400. When the reference data and the captured data CDATA do not match, the controller 240 may determine that the first phase of the first clock signal CLK1 has failed.

During a second phase of the first clock signal CLK1, the controller 240 may maintain the selection signal SEL instructing to output the first clock signal CLK1. Thereafter, the controller 240 may change the first parameter control values PCV from the first values to second values and generate second parameter control values PCV including the second values.

The memory host controller 230 may adjust parameters of control signals using the period of the first clock signal CLK1 and the second parameter control values PCV and output the control signals, the parameters of which are adjusted, to the memory device 310 through the cable 400. When the reference data and the captured data CDATA do not match, the controller 240 may determine that the second phase of the first clock signal CLK1 has failed.

During a last phase, i.e., an $m^{th}$ phase, of the first clock signal CLK1, the controller 240 may maintain the selection signal SEL instructing to output the first clock signal CLK1. In addition, the controller 240 may change an $(m-1)^{th}$ parameter control values PCV from $(m-1)^{th}$ values to $m^{th}$ values and generate $m^{th}$ parameter control values PCV including the $m^{th}$ values.

The memory host controller 230 may adjust parameters of control signals using the period of the first clock signal CLK1 and the $m^{th}$ parameter control values PCV and output the control signals, the parameters of which are adjusted, to the memory device 310 through the cable 400. When the reference data and the captured data CDATA do not match, the controller 240 may determine that the $m^{th}$ phase of the first clock signal CLK1 has failed.

Because the last phase, i.e., the $m^{th}$ phase, of the first clock signal CLK1 has also failed, the clock signal generator 220 may supply the second clock signal CLK2 instead of the first clock signal CLK1 to the memory host controller 230 under control of the controller 240 to perform a first phase of the second clock signal CLK2.

During the first phase of the second clock signal CLK2, the memory host controller 230 may generate $(m+1)^{th}$ parameter control values PCV including $(m+1)^{th}$ values.

The memory host controller 230 may adjust parameters of control signals using a period of the second clock signal CLK2 and the $(m+1)^{th}$ parameter control values PCV and output the control signals, the parameters of which are adjusted, to the memory device 310 through the cable 400. When the reference data and the captured data CDATA do not match, the controller 240 may determine that the first phase of the second clock signal CLK2 has failed.

During a second phase of the second clock signal CLK2, the controller 240 may maintain the selection signal SEL instructing to output the second clock signal CLK2, and generate $(m+2)^{th}$ parameter control values PCV including $(m+2)$ values.

The memory host controller 230 may adjust parameters of control signals using the period of the second clock signal CLK2 and the $(m+2)^{th}$ parameter control values PCV and output the control signals, the parameters of which are adjusted, to the memory device 310. When the reference data and the captured data CDATA match, the controller 240 may determine that the second phase of the second clock signal CLK2 is successful. Accordingly, the memory host controller 230 may perform a desired operation using control signals reflecting the parameters determined during the second phase of the second clock signal CLK2.

Figure 7:
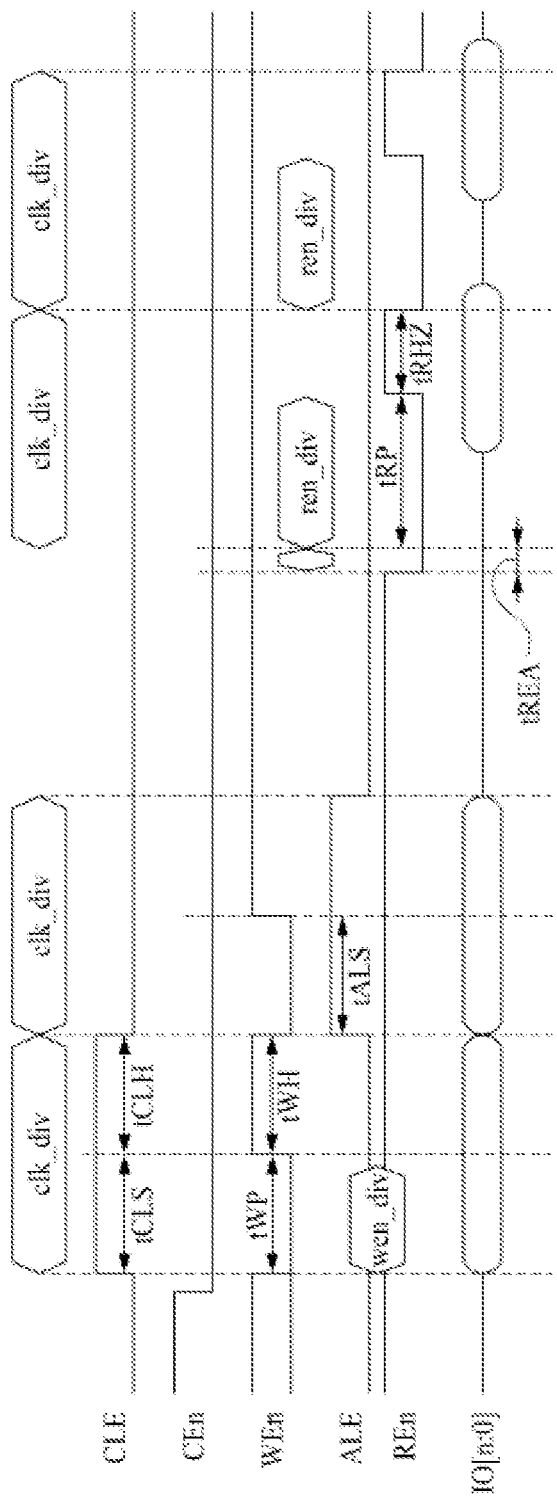
FIG. 7 is a timing diagram including control signals for a read ID command and parameters controlled by a clock signal and parameter control values.

FIG. 7 is a timing diagram including control signals for a read ID command, and parameters controlled by a clock signal and parameter control values. FIG. 8 illustrates parameters of the control signals for the read ID command of FIG. 7.

Referring to FIGS. 7 and 8, control signals for a read ID command (or read ID operation) for the memory device 310 include a command latch enable signal CLE, a chip enable signal CEn, a write enable signal WEn, an address latch enable signal ALE, and a write enable signal REn.

It is assumed that parameter control values PCV include a first control value clk_div, a second control value wen_div, and a third control value ren_div.

The memory host controller 230 may adjust a pulse width of the controller latch enable signal CLE so that a logic high section defined (or determined) by a CLE setup time tCLS and a CLE hold time tCLH may be maintained by CLK1 (or CLK2)*clk_div.

The memory host controller 230 may adjust the parameter tCLS and/or tCLH on the basis of a clock signal CLK1 or CLK2 and the first control value clk_div and generate the command latch enable signal CLE with the adjusted parameter tCLS and/or tCLH. As the first control value clk_div is changed, the parameter tCLS and/or tCLH may be changed.

The memory host controller 230 may adjust a pulse width of the write enable signal WEn so that a logic low section defined (or determined) by a write pulse width tWP may be maintained by CLK1 (or CLK2)*wen_div.

The memory host controller 230 may adjust the parameter tWP and/or tWH on the basis of the clock signal CLK1 or CLK2 and the second control value wen_div and generate the write enable signal WEn with the adjusted parameter tWP and/or tWH. As the second control value wen_div is changed, the parameter tWP and/or tWH may be changed.

The memory host controller 230 may adjust the pulse width of the read enable signal REn so that a logic low section defined (or determined) by a read pulse width tRP may be maintained by CLK1 (or CLK2)*ren_div.

The memory host controller 230 may adjust the parameter tRP on the basis of the clock signal CLK1 or CLK and the third control value ren_div and generate the write enable signal WEn with the adjusted parameter tRP. As the third control value ren_div is changed, the parameter tRP may be changed.

The memory host controller 230 may adjust each of the ALE setup time tALS and the WE high hold time tWH using a control value corresponding to the clock signal CLK1 or CLK2.

In some embodiments, the memory host controller 230 may adjust a parameter of a control signal using at least one control value and the clock signal CLK1 or CLK2, e.g., a period of the clock signal CLK1 or CLK2.

That is, the memory host controller 230 may adjust parameters of control signals for controlling operations of the memory device 310 using the clock signal CLK1 or CLK2 output from the clock signal generator 220 and parameter control values PCV output from the controller 240. The memory host controller 230 may generate control signals having adjusted parameters and output the generated control signals to the memory device 310.

Figure 9:
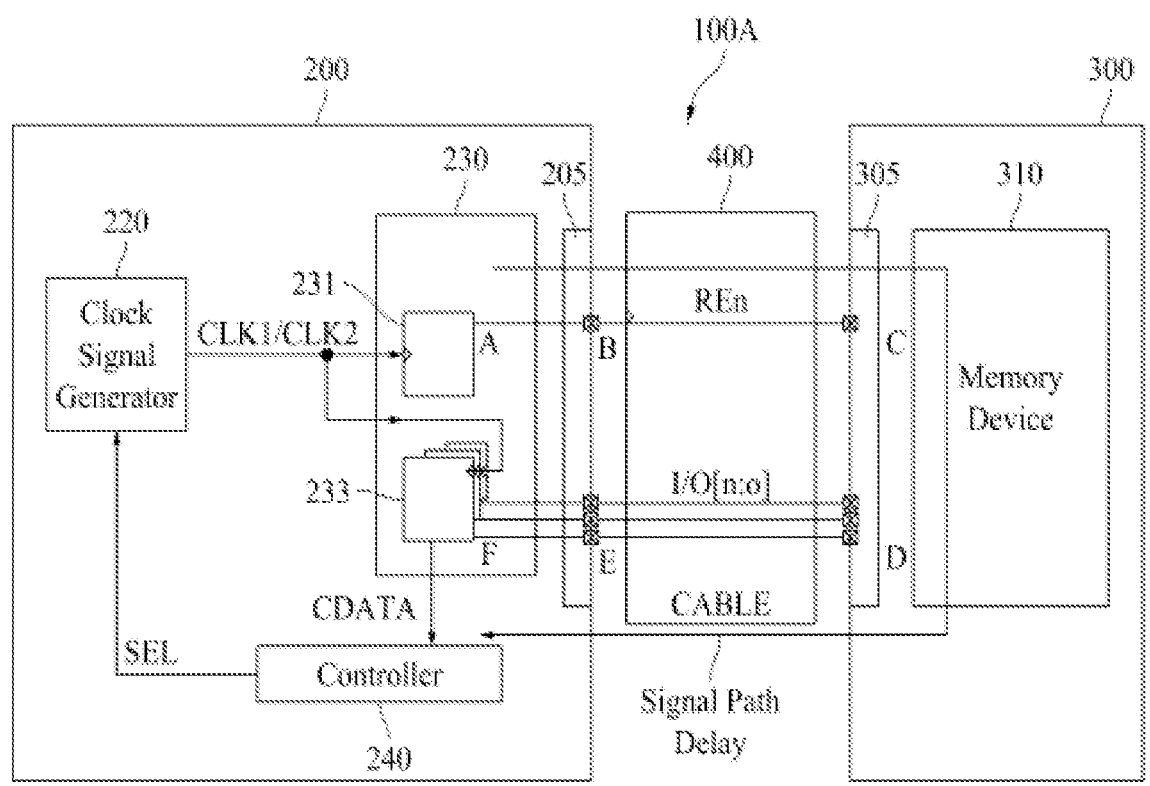
FIG. 9 is a block diagram of a memory system for controlling a pulse width of a read enable signal according to an embodiment of the present disclosure.
Figure 10:
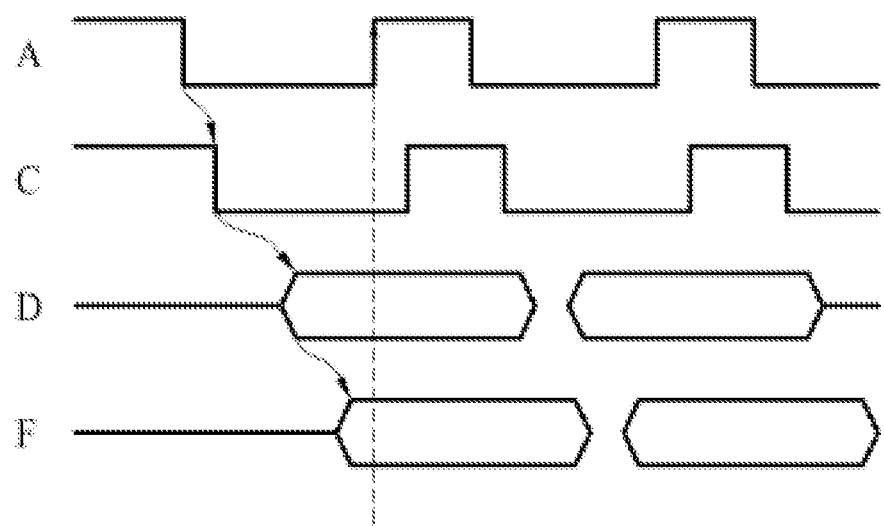
FIG. 10 is a timing diagram reflecting a signal path delay during a normal operation of the memory system of FIG. 9.
Figure 11:
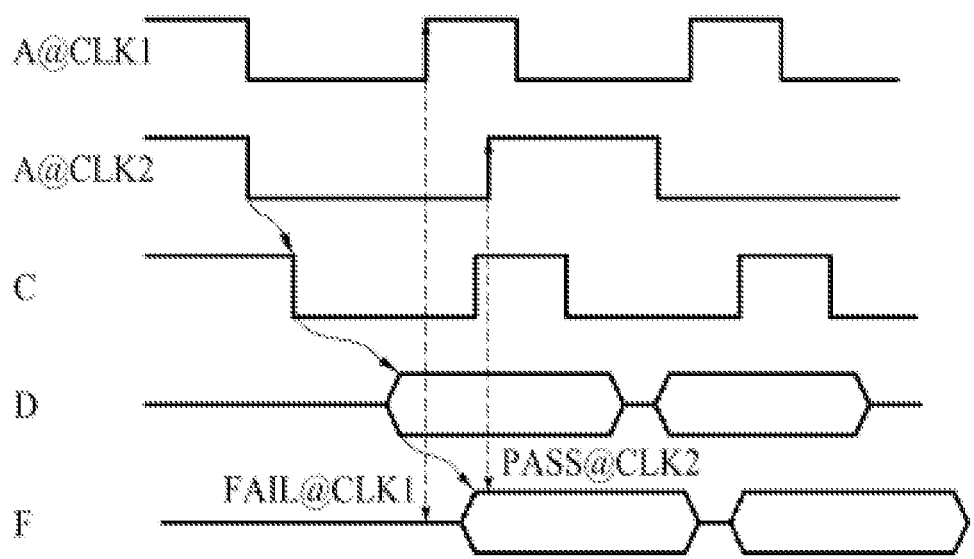
FIG. 11 is a timing diagram reflecting a signal path delay during an abnormal operation of the memory system of FIG. 9.

FIG. 9 is a block diagram of a memory system for controlling a pulse width of a read enable signal. FIG. 10 is a timing diagram reflecting a signal path delay during a normal operation of the memory system of FIG. 9. FIG. 11 is a timing diagram reflecting a signal path delay during an abnormal operation of the memory system of FIG. 9.

In FIGS. 9 to 11, for convenience of description, a read enable signal REn will be described as an example among control signals for controlling operations of the memory device 310.

Referring to FIGS. 9 to 11, in the case of a read command (e.g., a read ID command or a read Page command), when a control signal REn output from a first flip-flop 231 of a memory host controller 230 is transmitted to a memory device 310 through a first connector 205, a cable 400, and a second connector 305, the memory device 310 may read data from a memory cell array in response to the read command and transmit the read data to a second flip-flop 233 through the second connector 305, the cable 400, and the first connector 205.

As such, a delay caused due to a signal path from an output A of the first flip-flop 231 to an input F of the second flip-flop 233 is referred to as a signal path delay.

To develop a set model, a signal path delay may be generally determined by the cable 400 when a timing controller 210 and the memory device 310 are connected by the cable 400. When a length of the cable 400 is not determined, a signal path delay may not be determined.

FIG. 10 illustrates waveforms of a read enable signal REn at nodes A, C, D, and F during a normal operation, i.e., when captured data CDATA is valid data. When parameters of the read enable signal REn match a signal path delay, the captured data CDATA may be valid data.

However, as illustrated in FIG. 11, when parameters of a read enable signal REn generated using a first clock signal CLK1 do not match the signal path delay, the capture data CDATA may be different from the valid data. Accordingly, the second flip-flops 233 cannot generate captured data CDATA identical to reference data by using the first clock signal CLK1.

When captured data CDATA obtained using the first clock signal CLK1 is not valid data, the timing controller 210 may supply a second clock signal CLK2 to the memory host controller 230 instead of the first clock signal CLK1 and supply parameter control values PCV to the memory host controller 230.

The memory host controller 230 may adjust parameters of control signals using the second clock signal CLK2 and the parameter control values PCV, generate the control signals with the adjusted parameters, and output the generated control signals to the memory device 310.

As illustrated in FIG. 11, when the first clock signal CLK1 is supplied to the first flip-flop 231, an output signal A@CLK1 of the first flip-flop 231 may be a read enable signal REn corresponding to a parameter adjusted using the first clock signal CLK1 and a read enable signal parameter control value.

When the first clock signal CLK1 is supplied to the second flip-flops 233, captured data CDATA captured by the second flip-flops 233 is not valid data and thus a valid search using the first clock signal may fail.

As illustrated in FIG. 11, when the second clock signal CLK2 is supplied to the first flip-flop 231, an output signal A@CLK2 of the first flip-flop 231 may be a read enable signal REn corresponding to a parameter adjusted using the second clock signal CLK2 and a read enable signal parameter control value.

When the second clock signal CLK2 is supplied to the second flip-flops 233, captured data CDATA captured by the second flip-flops 233 is valid data and thus a valid search using the second clock signal CLK2 may be passed (or be successful).

Figure 12:
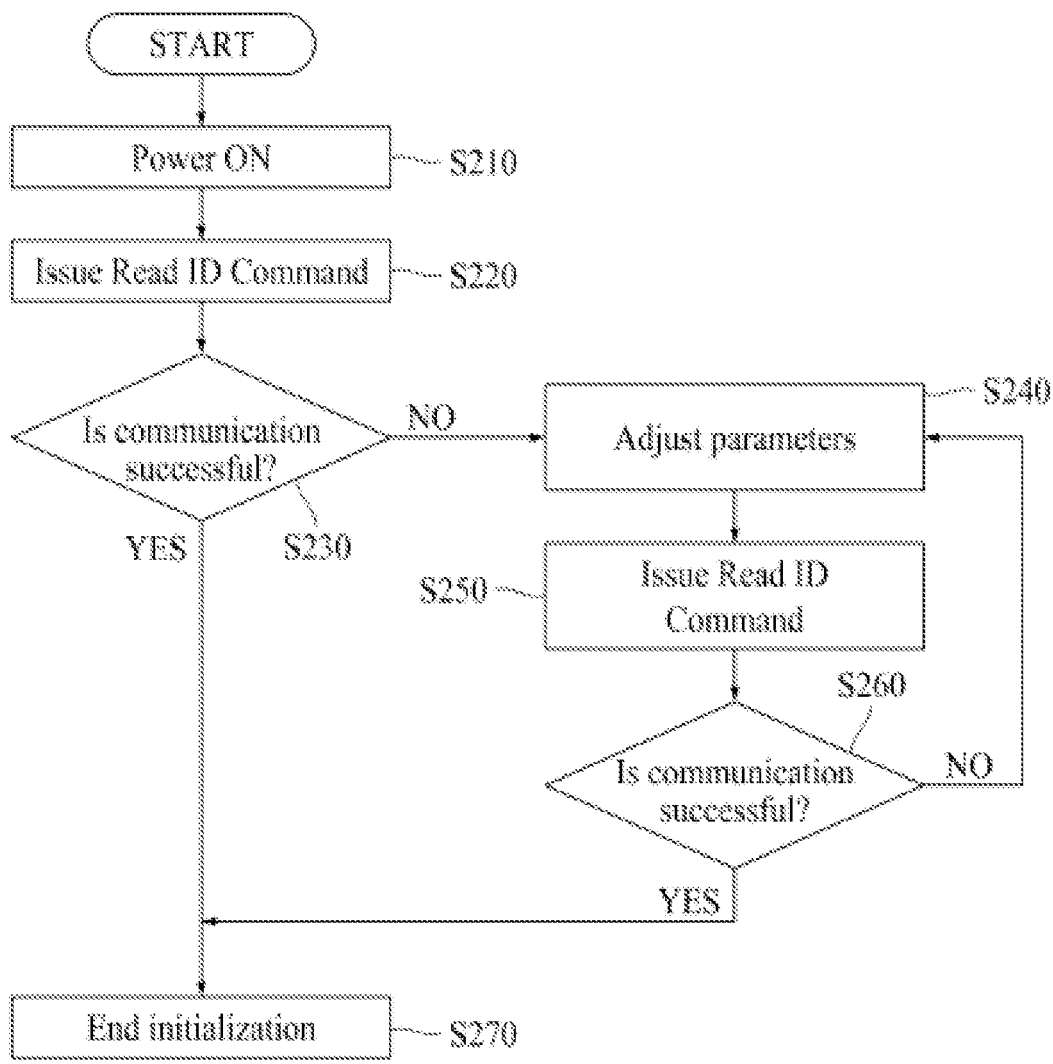
FIG. 12 is a flowchart of a method of adjusting parameters corresponding to a read ID command.

FIG. 12 is a flowchart of a method of adjusting parameters corresponding to a read ID command.

First, the memory system 100 is powered on (S210). The controller 240 generates a selection signal SEL instructing to output a first clock signal CLK and outputs a read ID command CMD and parameter control values PCV to the memory host controller 230 (S220).

The memory host controller 230 adjusts parameters tCLS, tCLH, tALS, tALH, tWP, tRP, etc. using the first clock signal CLK1 and the parameter control values PCV and generates control signals CLE, CEn, WEn, ALE, and REn corresponding to the read ID command CMD using the adjusted parameters tCLS, tCLH, tALS, tALH, tWP, tRP, etc.

As described above with reference to FIG. 7, the parameter control values PCV may include a first control value clk_div, a second control value wen_div, and a third control value ren_div.

The memory host controller 230 adjusts the parameters tCLS, tCLH, tALS, tALH, tWP, tRP, etc. while changing the parameter control values PCV sequentially (or in a predetermined order) without changing the first clock signal CLK1 until communication using the first clock signal CLK1 is successful (until the valid search is successful or until captured data CDATA is valid data) (S230). The memory host controller 230 generates the control signals CLE, CEn, WEn, ALE, and REn corresponding to the read ID command CMD using the adjusted parameters tCLS, tCLH, tALS, tALH, tWP, tRP, etc.

When communication using the first clock signal CLK1 is successful (YES in S230), an initialization process is ended with the control signals CLE, CEn, WEn, ALE, and REn, which include the parameters tCLS, tCLH, tALS, tALH, tWP, tRP, etc., when communication using the first clock signal CLK1 is successful (S270).

However, when communication using the first clock signal CLK1 is not successful (NO in S230), the memory host controller 230 readjusts the parameters tCLS., tCLH, tALS, tALH, tWP, tRP, etc. using a second clock signal CLK2 and the parameter control values PCV (S240). The memory host controller 230 generates the control signals CLE, CEn, WEn, ALE, and REn corresponding to a read ID command CMD using the adjusted parameters tCLS, tCLH, tALS, tALH, tWP, tRP, etc. and outputs the control signals CLE, CEn, WEn, ALE, and REn to the memory device 310 (S250).

The memory host controller 230 adjusts the parameters tCLS, tCLH, tALS, tALH, tWP, tRP, etc. while changing the parameter control values PCV sequentially (or in a predetermined order) without changing the second clock signal CLK2 until communication using the second clock signal CLK2 is successful (until the valid search is successful or until captured data CDATA is valid data) (S260). The memory host controller 230 generates the control signals CLE, CEn, WEn, ALE, and REn corresponding to the read ID command CMD using the adjusted parameters tCLS, tCLH, tALS, tALH, tWP, tRP, etc. (S260).

When communication using the second clock signal CLK2 is successful (YES in S260), an initialization process is ended with the control signals CLE, CEn, WEn, ALE, and REn, which include the parameters tCLS, tCLH, tALS, tALH, tWP, tRP, etc., when communication using the second clock signal CLK2 is successful (S270).

However, when communication using the second clock signal CLK2 is not successful (NO in S260), the memory host controller 230 readjusts the parameters tCLS., tCLH, tALS, tALH, tWP, tRP, etc. using a third clock signal CLK2 and the parameter control values PCV (S240). The memory host controller 230 generates the control signals CLE, CEn, WEn, ALE, and REn corresponding to the read ID command CMD using the adjusted parameters tCLS, tCLH, tALS, tALH, tWP, tRP, etc. and outputs the control signals CLE, CEn, WEn, ALE, and REn to the memory device 310 (S250).

A scenario of operating the timing controller 210 when a control signal is the read enable signal REn, a parameter to be controlled is the read pulse width tRP, and a frequency of the first clock signal CLK1 first supplied is 200 MHz (=5 ns) is as follows.

During a first phase (or first attempt) of the first clock signal CLK1, when the third control value ren_div among the parameter control values PCV is 10 (i.e., a minimum value), tRP=50 ns and the operation of the timing controller 210 fails.

During a second phase of the first clock signal CLK1, when the third control value ren_div is 20, tRP=100 ns and the operation of the timing controller 210 fails.

During a last phase of the first clock signal CLK1, when the third control value ren_div is 100 (i.e., a maximum value), tRP=500 ns, and the operation of the timing controller 210 fails.

The timing controller 210 selects a second clock signal CLK2 having a frequency of 100 MHz (=10 ns).

During a first phase (or first attempt) of the second clock signal CLK2, when the third control value ren_div is 50 (i.e., the minimum value), tRP=500 ns and the operation of the timing controller 210 fails.

During a second phase of the second clock signal CLK2, when the third control value ren_div is 60, tRP=600 ns and the operation of the timing controller 210 fails.

During a last phase of the second clock signal CLK2, when the third control value ren_div is 80 (i.e., the maximum value), tRP=800 ns and the operation of the timing controller 210 is successful.

A timing controller according to an embodiment of the present disclosure can select parameters, which match a signal path delay, which is a delay of a signal path for transmission of data output from the memory device, of control signals for control of a memory device in response to the control signals while changing parameters of the control signals and a frequency of a clock signal related to generation of the control signals until it is determined that the data is valid data.

A timing controller according to the embodiment of the present disclosure is capable of quickly performing a valid search to adjust (or select) parameters of control signals matching to a signal path delay even when the signal path delay is changed according to design specifications.

It will be understood by those of ordinary skill in the art to which the present disclosure pertains that the above-described present disclosure may be implemented in different forms without changing the technical spirit or essential features thereof.

Accordingly, the embodiments set forth herein should be considered only as examples and not for purposes of limitation. The scope of the present disclosure should be defined by the following claims other than the detailed description, and all changes or modifications derivable from the claims and their equivalents should be construed as being included in the scope of the present disclosure.

What is claimed is:

1. An electronic device comprising:
a memory device; and
a timing controller configured to output control signals, which are generated using a first clock signal, to the memory device, generate first captured data by capturing first data, which is output from the memory device, using the first clock signal in response to the control signals, and generate control signals using a second clock signal and output the control signals to the memory device when the first captured data is not valid data,
wherein the timing controller is configured to divide a frequency of the first clock signal to generate the second clock signal.

2. The electronic device of claim 1, wherein the timing controller adjusts parameters of the control signals using the second clock signal and parameter control values and outputs the control signals having the adjusted parameters to the memory device when the first captured data is not the valid data.

3. The electronic device of claim 2, wherein the control signals comprise control signals for a read ID command or a read page command.

4. The electronic device of claim 2, wherein the control signals for a read ID command comprise a command latch enable signal, a chip enable signal, a write enable signal, an address latch enable signal, and a read enable signal, and the parameters comprise at least two of a CLE setup time, a CLE hold time, a write pulse width, an ALE setup time, and a read pulse width.

5. The electronic device of claim 2, wherein the timing controller captures second data, which is output from the memory device using the second clock signal in response to the control signals having the adjusted parameters, to generate second captured data, adjusts the parameters of the control signals while changing the parameter control values until the second captured data becomes the valid data, and outputs the control signals having the adjusted parameters to the memory device.

6. The electronic device of claim 2, further comprising:
a first printed circuit board (PCB) including the timing controller and a first connector connected to the timing controller;
a second PCB including the memory device and a second connector connected to the memory device; and
a cable connected to the first connector and the second connector and including lines for transmitting the control signals and the first data.

7. The electronic device of claim 2, wherein the timing controller comprises:
a clock signal generator configured to output the first clock signal or the second clock signal in response to a selection signal;
a memory host controller configured to output the control signals generated using the first clock signal to the memory device and capture the first data, which is output from the memory device using the first clock signal in response to the control signals, to generate the first captured data; and
a controller configured to determine whether the first captured data is the valid data according to a result of comparing reference data with the first captured data and generate the selection signal instructing the second clock signal to be output and change the parameter control values when the reference data and the first captured data do not match,
wherein the memory host controller adjusts the parameters of the control signals using the second clock signal and the changed parameter control values and outputs the control signals having the adjusted parameters to the memory device.

8. A timing controller comprising:
a clock signal generator configured to output any one of a first clock signal and a second clock signal in response to a selection signal; and
a memory host controller configured to output control signals generated using the first clock signal to a memory device, capture first data, which is output from the memory device using the first clock signal in response to the control signals, to generate first captured data, and generate the control signals using the second clock signal and output the control signals to the memory device when the first captured data is not valid data,
wherein the clock signal generator is configured to divide a frequency of the first clock signal to generate the second clock signal.

9. The timing controller of claim 8, wherein the clock signal generator comprises:
a clock source configured to generate the first clock signal;
a frequency divider configured to divide the frequency of the first clock signal to generate the second clock signal having a frequency divided from the frequency of the first clock signal; and
a multiplexer configured to output an output signal of the clock source or an output signal of the frequency divider to the memory host controller in response to the selection signal.

10. The timing controller of claim 8, further comprising a controller configured to determine whether the first captured data is the valid data according to a result of comparing reference data with the first captured data and output the selection signal, which instructs the second clock signal to be output, to the clock signal generator when the reference data and the first captured data do not match.

11. The timing controller of claim 8, further comprising a controller configured to determine whether the first captured data is the valid data according to a result of comparing reference data with the first captured data and generate the selection signal instructing the second clock signal to be output and parameter control values for controlling parameters of the control signals when the reference data and the first captured data do not match,
wherein the memory host controller adjusts the parameters of the control signals using the second clock signal and the parameter control values and outputs the control signals having the adjusted parameters to the memory device.

12. The timing controller of claim 11, wherein the control signals comprise a command latch enable signal, a chip enable signal, a write enable signal, an address latch enable signal, and a read enable signal, and
the parameters comprise at least two of a CLE setup time, a CLE hold time, a write pulse width, an ALE setup time, and a read pulse width.

13. An operating method of a timing controller, the method comprising:
determining whether data from a memory device is valid data in response to control signals generated using a clock signal; and
until parameters of the control signals matching a signal path delay are selected, changing parameters of the control signals and a frequency of the clock signal associated with the parameters of the control signals, the signal path delay being a signal path for transmission of the data,
wherein each of the parameters is changed on the basis of a product of each of the parameter control values and the clock signal having the changed frequency.

14. The operating method of claim 13, wherein the control signals for a read command comprise a command latch enable signal, a chip enable signal, a write enable signal, an address latch enable signal, and a read enable signal, and
the parameters comprise at least two of a CLE setup time, a CLE hold time, a write pulse width, an ALE setup time, and a read pulse width.

* * * * *